(12) United States Patent
Chen et al.

(10) Patent No.: US 12,200,898 B2
(45) Date of Patent: Jan. 14, 2025

(54) SYSTEM AND METHOD FOR MANAGING COMPONENT POSITIONING AND ORIENTATION IN DATA PROCESSING SYSTEMS

(71) Applicant: Dell Products L.P., Round Rock, TX (US)

(72) Inventors: Julian Yu-Hao Chen, Austin, TX (US); Shun-Cheng Hsu, Zhubei (TW); Hung-Jen Chen, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 266 days.

(21) Appl. No.: 18/048,124

(22) Filed: Oct. 20, 2022

(65) Prior Publication Data

US 2024/0138101 A1 Apr. 25, 2024
US 2024/0237273 A9 Jul. 11, 2024

(51) Int. Cl.
*H05K 7/20* (2006.01)
*G06F 1/20* (2006.01)

(52) U.S. Cl.
CPC .......... *H05K 7/20172* (2013.01); *G06F 1/20* (2013.01)

(58) Field of Classification Search
CPC .... H05K 7/1424; H05K 7/20; H05K 7/20136; H05K 7/20145; H05K 7/20172; H05K 7/20336; H05K 7/20509; H05K 7/20554; H05K 7/20718; H05K 5/0221; H05K 9/0015; G06F 1/20; G06F 1/206
See application file for complete search history.

(56) References Cited

U.S. PATENT DOCUMENTS

| | | | |
|---|---|---|---|
| 5,602,721 A | 2/1997 | Slade et al. | |
| 5,761,033 A | 6/1998 | Wilhelm | |
| 6,031,717 A * | 2/2000 | Baddour | G06F 1/20 361/679.48 |
| 7,048,498 B2 * | 5/2006 | Kosugi | F04D 29/663 415/214.1 |
| 7,698,095 B2 | 4/2010 | Chung et al. | |
| 7,701,713 B2 | 4/2010 | Li | |
| 8,182,319 B2 | 5/2012 | Ong et al. | |
| 8,550,702 B2 | 10/2013 | Campbell et al. | |
| 9,129,958 B2 | 9/2015 | Mallik et al. | |
| 9,237,671 B2 | 1/2016 | Chen et al. | |
| 9,820,411 B2 | 11/2017 | Alshinnawi et al. | |
| 10,123,452 B2 | 11/2018 | Chen et al. | |
| 10,177,107 B2 | 1/2019 | Camarota | |
| 10,274,945 B2 | 4/2019 | Arensmeier et al. | |

(Continued)

*Primary Examiner* — Amir A Jalali
(74) *Attorney, Agent, or Firm* — Womble Bond Dickinson (US) LLP

(57) ABSTRACT

Methods and systems for managing the operation of data processing systems are disclosed. A data processing system may include a computing device that may provide computer implemented services. To provide the computer implemented services, hardware components of the data processing system may need to operate in predetermined manners. To manage the operation of the hardware components, the data processing system may cool them when their temperatures fall outside of thermal operating ranges. To facilitate cooling, fans may be densely packed and arranged in a manner the occupies a majority of the space in a stack up. At least one side of the fans may be exposed and may not be covered.

20 Claims, 9 Drawing Sheets

(56) References Cited

U.S. PATENT DOCUMENTS

| | | |
|---|---|---|
| 10,709,032 B1 | 7/2020 | Holyoake et al. |
| 10,802,553 B1* | 10/2020 | Chang .................... G06F 1/184 |
| 11,019,748 B2* | 5/2021 | Avvaru ................ H05K 7/1489 |
| 11,064,808 B2 | 7/2021 | Chen et al. |
| 11,129,293 B2 | 9/2021 | Wurmfeld |
| 11,262,809 B2 | 3/2022 | Pham et al. |
| 11,293,659 B2 | 4/2022 | Brahme et al. |
| 11,320,164 B2 | 5/2022 | Roth |
| 2001/0040203 A1 | 11/2001 | Brock et al. |
| 2007/0206353 A1* | 9/2007 | Boone ................ H05K 7/20727 361/694 |
| 2010/0107397 A1* | 5/2010 | Letourneau ........ H05K 7/20172 29/466 |
| 2011/0100668 A1 | 5/2011 | Syed |
| 2011/0228473 A1 | 9/2011 | Anderson et al. |
| 2012/0229971 A1 | 9/2012 | Mills et al. |
| 2012/0243178 A1* | 9/2012 | Zhang .................... G06F 1/187 361/756 |
| 2014/0118937 A1* | 5/2014 | Adrian ................ H05K 7/20172 361/695 |
| 2014/0334084 A1 | 11/2014 | Fricker |
| 2015/0177750 A1 | 6/2015 | Bailey et al. |
| 2015/0180234 A1 | 6/2015 | Bailey et al. |
| 2015/0289405 A1 | 10/2015 | Stewart et al. |
| 2015/0359146 A1 | 12/2015 | Bailey et al. |
| 2016/0044819 A1 | 2/2016 | Bailey et al. |
| 2016/0174409 A1* | 6/2016 | Mease ................ H05K 7/20172 361/695 |
| 2017/0177007 A1 | 6/2017 | Shelnutt et al. |
| 2017/0181329 A1 | 6/2017 | Shelnutt et al. |
| 2018/0011522 A1 | 1/2018 | Shirakami et al. |
| 2019/0104632 A1* | 4/2019 | Nelson ................ H05K 7/20727 |
| 2022/0104380 A1 | 3/2022 | Hattangadi et al. |
| 2022/0141995 A1* | 5/2022 | Dikken .............. H05K 7/20172 361/679.48 |
| 2022/0192051 A1* | 6/2022 | Ho ...................... H05K 7/20172 |
| 2022/0200250 A1 | 6/2022 | Brooks et al. |
| 2024/0138102 A1* | 4/2024 | Huang .................... G06F 1/20 |

* cited by examiner

SYSTEM AND METHOD FOR MANAGING COMPONENT POSITIONING AND ORIENTATION IN DATA PROCESSING SYSTEMS

FIELD OF THE EMBODIMENTS

Embodiments disclosed herein relate generally to thermal management of devices. More particularly, embodiments disclosed herein relate to systems and methods for conserving area for cooling devices.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

DETAILED DESCRIPTION

Figure 1A:
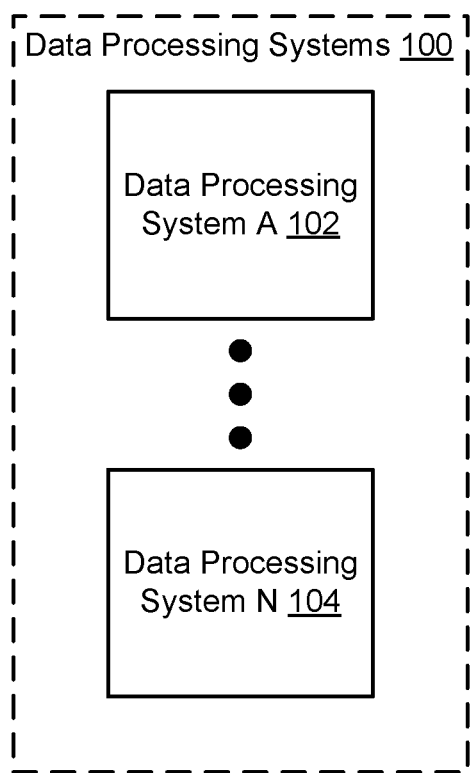
FIG. 1A shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable device. In the context of a static device, "adapted to" may indicate that the device include circuitry to perform the functionality described with respect to the static device.

In general, embodiments disclosed herein relate to methods and systems for providing computer implemented services using data processing systems. To provide the computer implemented services, the data processing system may include hardware components that generate heat. The heat may need to be dissipated for continued operation of the hardware components.

To dissipate heat, the data processing system may include an enclosure that includes areas for fans and the hardware components. To improve the rate of cooling of the hardware components, the fans may be positioned adjacent to one another and may not be covered by a cover. Consequently, the contribution of the enclosure to the stack up height may be reduced, and larger fans may be used. The larger fans may generate a higher volume of airflow when compared to smaller fans thereby improving the rate of thermal dissipation of heat from the hardware devices.

To protect the hardware components, the enclosure may include a cover that only covers the hardware components. To improve computing density, the top of the cover may be aligned with the top of the fans. By doing so, the stack up height of the area in which the fans are positioned may be similar to the are in which the hardware components are positioned. By doing so, more enclosures per unit of vertical space may be positioned within the same space thereby improving the density of hardware resources (e.g., processors, memory modules, etc.) in space.

By doing so, embodiments disclosed herein may provide a data processing system capable of dissipating greater thermal loads while increasing the density of computing resources. Thus, embodiments disclosed herein may address the technical problems of computing resource density and cooling in computing environments. The disclosed embodiments may address these problem by providing a data processing system that facilitates higher rates of thermal dissipation and increased computing resource density.

In an embodiment, a data processing system that provides computer implemented services is provided. The data processing system may include a payload comprising hardware components that provides the computer implemented services; fans to cool the payload while the hardware components are providing the computer implemented services; an enclosure comprising: a payload area in which the payload is positioned, and a fan area in which the fans are positioned; and a cover that covers the payload and leaves the fans exposed while the cover is closed.

A top of the cover and tops of the fans may be substantially coplanar while the cover is closed. Substantially coplanar may indicate that the tops of the fans and the top of the cover are coplanar within manufacturing tolerances and/or misalignment due to stack up errors, but are not designed to be offset from one another (e.g., such as when a cover may cover the fans thereby placing the top of the cover in a plane that is parallel to the plane in which the top of the fans reside.)

While the cover is closed, the fans may transmit at least a portion of force applied by the cover to a base of the data processing system.

The fan area may include a wall comprising fixation elements for reversible attachment of a portion of the fans, the fixation elements aligning airflows generated by the portion of the fans with holes in the wall; a portion of a base on which the fans as positioned while in the enclosure, the base comprising: keys having a shape that orients the portion of the fans positioned in the enclosure, the keys, during an insertion of a fan of the portion of the fans, preventing the fan from being seated unless oriented in a predetermined orientation; flanges positioned a distance away from the wall to accommodate positioning of two fans of the fans between the flange and the wall, the wall being position at a first end of the base; a guard adapted to attach to a fan of the fans, the guard comprising: a cover seat to receive the cover while the cover closes the payload area; attachment elements to reversibly attach the guard to the fan; and a frame having a shape that connects the attachment elements to the cover seat and that, when connected to the fan, positions the cover seat a predetermined distance below a top of the fan, the top of the fan being positioned proximate to a top of the data processing system.

Each of the flanges may include a raised portion that prevents the two fans from moving away from the wall while the two fans are on the portion of the base.

Each of the fans may include a face; an attachment receptacle on the face, the attachment receptacle having a shape that is complementary to a shape of one of the fixation elements.

The shape of the one of the fixation elements limits motion of a fan of the two fans with respect to the wall while the one of the fixation elements is positioned in the attachment receptacle.

The motion of the fan of the two fans is limited along the wall and allowed in a direction orthogonal to a surface of the wall to which the face of the fan of the two fans is positioned while the one of the fixation elements is positioned in the attachment receptacle.

While the fans are in the fan area, the fans may be positioned directly adjacent to one another across a width of the fan area, and the fans being oriented, while in the fan area, to generate a flow of gas directed across the width of the fan area and through the payload area to cool the payload.

A height of the data processing system may be within a height of a stack up of a base of the enclosure and the fans. The fans may be positioned in a single layer on the base.

The base may have a thickness of a single layer of material (e.g., a sheet) that delimits a thickness of the base.

While covering the payload, the cover may be a same or a smaller distance away from the base than the height of the fans positioned on the single layer of the base.

Turning to FIG. 1A, a block diagram illustrating a system in accordance with an embodiment is shown. The system shown in FIG. 1A may provide any quantity and type of computer implemented services. To provide the computer implemented services, the system of FIG. 1A may include data processing systems 100.

All, or a portion, of data processing systems 102-104 may provide computer implemented services to users and/or other computing devices operably connected to data processing systems 100. The computer implemented services may include any type and quantity of services including, for example, database services, instant messaging services, video conferencing services, etc. Data processing systems 100 may provide other types of computer implemented services without departing from embodiments disclosed herein. Data processing systems 100 may each provide similar and/or different computer implemented services, and any of data processing systems 100 may provide any of the computer implemented services in cooperation with other data processing systems and/or independently.

To provide computer implemented services, data processing systems 100 may need to operate in a predetermined manner. The predetermined manner of operation may include, for example, executing an operating system, drivers, and/or other type of management entities that mediate, facilitate, or otherwise operate in a manner which enables the applications to operate (e.g., by providing abstracted access to hardware resources used in the execution of the applications).

To operate in the predetermined manner, data processing systems 100 may perform one or more operations to enter the predetermined manner of operation (by changing from other manners of operation to the predetermined manner of operation). These operations may include, for example, a boot process from a power-on (or reset or other manner of operation that differs from the predetermined manner of operation to the extent that the applications may not be able to operate) to hand off operation management of the data processing system to an operating system or other type of operational management entity that places data processing systems 100 into the predetermined manner of operation. The operating system may, for example, provide abstracted access to resources (e.g., processing resources provided by processors, memory resource provided by memory modules, storage resources provided by storage devices, etc.) utilized by the applications hosted by the data processing system.

For example, consider a scenario where a data processing system has been shut off. After the data processing system is turned on, the data processing system may be operating in a startup manner such that the data processing system is not yet able to support execution of an application (e.g., the application may not be able to successfully execute until the data processing system hosts an operating system or other type of management entity). To enter the predetermine manner of operation conducive to execution of the application, the data processing system may go through a boot process (e.g., a startup) which may be performed by one or more types of management entity such as a basic input-output system and/or other startup management entities. The management entity may perform any number of actions (e.g., a "startup process") to prepare the data processing system to begin execution of an operating system and/or other type of management entity that facilitates execution of applications.

To perform the startup process and provide the computer implemented services, data processing systems 100 may include various hardware components (e.g., integrated circuit-based devices). The hardware components may perform various types of functionalities such as data processing functionality, communication functionality, etc.

When providing their functionalities, any of the hardware components may consume electricity and generate heat. Any of the hardware components may have limitations on their operation. For example, any of the hardware components may have limitations regarding their temperatures (e.g., hardware components having such limitations being referred to as "temperature sensitive hardware components"). The temperature limitations may include an upper temperature limit. If temperatures of the temperature sensitive hardware components fall outside of the upper limit, then the corresponding temperature sensitive hardware components may be impaired (e.g., may not operate, may operate but in an undesirable manner such as including errors in their operation, may be subject to damage if operated, etc.).

In general, embodiments disclosed herein relate to systems, devices, and methods for improving the likelihood that data processing systems 100 are able to provide their computer implemented services. To improve the likelihood that data processing systems 100 are able to provide their computer implemented services, data processing systems 100 may include functionality to cool hardware components.

For example, data processing systems 100 may include fans. The fans may generate a flow of a gas (e.g., air or other ambient gasses, specific mixes of gases, gasses that have been process via heating/cooling/ventilation systems, etc.) which may be used to cool the hardware component.

Figure 1B:
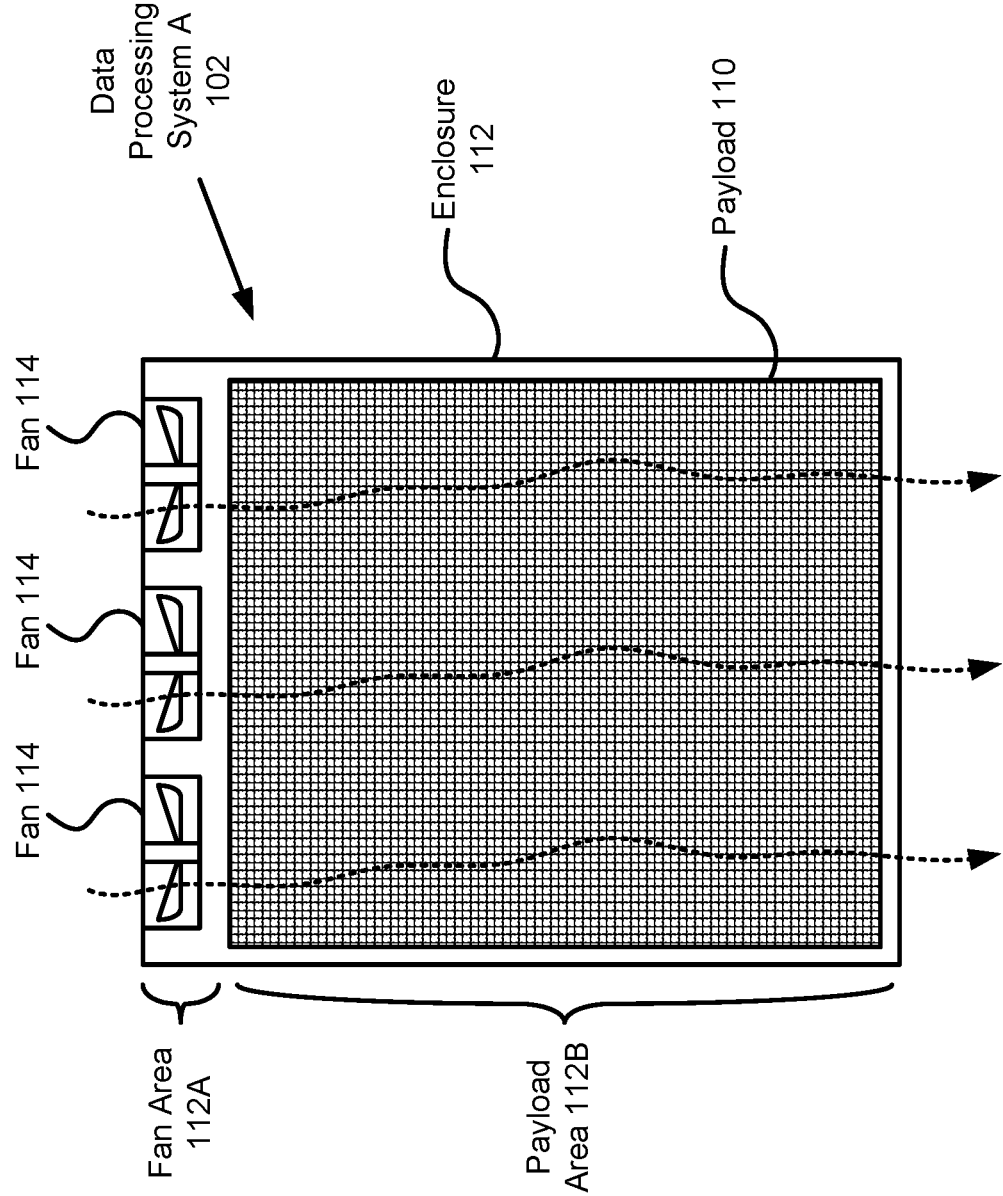
FIG. 1B shows a top view diagram illustrating gas flow in a data processing system in accordance with an embodiment.

To facilitate cooling while also facilitating modularity and/or higher density in computing environment, (i) the fans of the data processing system may be arranged in a specific manner, (ii) an enclosure for the data processing system used to house the fans and the hardware components may also include features for retaining the placement of the fans that also conserve the area within the enclosure used for the fans, and (iii) a guard, attachable to a fan, may be used in part to distribute forces from the enclosure through the fans to improve the structural integrity of the enclosure while conserving the area within the enclosure used for structural integrity purposes. By doing so, embodiments disclosed herein may provide a data processing system having a limited stack up height and that is still able to generate sufficient flows of gas to cool hardware components of the data processing system. Refer to FIG. 1B for additional details regarding flows of gas within data processing system, and FIGS. 1C-1I for additional details regarding components of data processing systems 100.

Any of data processing systems 100 may be implemented using a computing device such as a host or server, a personal computer (e.g., desktops, laptops, and tablets), a "thin" client, a personal digital assistant (PDA), a Web enabled appliance, a mobile phone (e.g., Smartphone), and/or any other type of computing device or system. For additional details regarding computing devices, refer to FIG. 2.

The system of FIG. 1A may include any number and types of data processing systems 100. Any of the aforementioned devices may operate independently and/or cooperatively to provide computer implemented services. Data processing systems 100 may provide such services to, for example, user of the data processing systems 100, to other data processing systems 100, and/or to other devices not shown in FIG. 1A.

Data processing systems 100 may be operably connected to any of each other and/or other devices via a communication system (not shown). The communication system may include one or more networks that facilitate communication between data processing systems 100 (or portions thereof) and/or other devices. The networks may include, for example, wired networks, wireless network, public networks, private network, the Internet, etc.

While illustrated in FIG. 1A as including a limited number of specific components, a system in accordance with an embodiment may include fewer, additional, and/or different components than those illustrated therein.

As noted above, the hardware component of data processing systems may generate heat that may need to be dissipated for the hardware components to continue to operate and provide desired computer implemented services. FIG. 1B shows an example of airflows (e.g., flows of any types/combinations of gasses) that may be used to dissipate heat from hardware components.

Turning to FIG. 1B, a top view diagram of data processing system A 102 in accordance with an embodiment is shown. Any of data processing systems 100 may be similar to data processing system A 102.

As seen in FIG. 1B, data processing system A 102 may payload 110, enclosure 112, and any number of fans 114. Each of these components is discussed below.

Enclosure 112 may include a chassis usable to house other components of data processing system A 112. The chassis may be any type of chassis. For example, the chassis may be a rack mount chassis, a sled, and/or other type of structure for housing components of a data processing system.

To improve the density of computing resources, enclosure 112 may include features to reduce its stack up height. By doing so, more data processing system may be stacked vertically for a given vertical height thereby increase the density of computing resources (e.g., by including larger numbers of processors, memory modules, etc. in the area).

Generally, enclosure 112 may be implemented with a physical structure including one or more areas in which payload 110, fans 114, and/or other components may be positioned. For example, enclosure 112 may include fan area 112A in which fans may be positioned and payload area 112B in which payload 110 may be positioned. Refer to FIGS. 1D-1I for additional details regarding enclosure 112

Payload 110 may include any number and types of hardware components. The hardware components may, at least in part, provide the computer implemented services offered by data processing system A 102. Any of the hardware components of data processing system A may be a temperature sensitive hardware component. Payload 110 may be positioned in payload area 112B.

To manage the temperatures of the temperature sensitive hardware components, any number of fans (e.g., 114) may be positioned in fan area 112A. Fans 114 may selectively generate a flow of gas (e.g., illustrated in FIG. 1B with wavy dashed lines terminating in arrows, top to bottom of the page). The flow of gas may flow proximate to payload 110 thereby facilitating thermal exchange which may cool any of the hardware components of payload 110. While not shown in FIG. 1B, data processing system A 102 may include other types of thermal management components (e.g., temperature sensors, controllers, etc.) to orchestrate when and at what rate to generate the flow of the gas.

To facilitate increased rate of gas flow and improved computing resources density, fan area 112A may include a number of features that facilitate tight packing of fans. The fans may substantially occupy all of the horizontal (e.g., across the page) and vertical space (e.g., into the page) to improve gas flow rates while also reducing use of space in which hardware components are not positioned (e.g., in comparison to scenarios in which various components may be positioned above/below/to the side of some of the fans). Refer to FIGS. 1D-3I for additional details regarding packing of fans in fan area 112A.

Additionally, to limit exposure to an ambient environment, enclosure 112 may include a cover (not shown, refer to FIGS. 1G-1D) that encloses a top of enclosure 112. To limit the stack up height of data processing system A 102, the cover may not cover any of fan area 112A. Rather, the cover, when closed, may be substantially aligned with a top of the fans. In this manner, the total stack up height of the data processing system may be limited to a sum of the thickness of a base of the enclosure and a height of the fans positioned in fan area 112A on the base of the enclosure.

To further clarify aspects of data processing systems, FIGS. 1C-1I show diagrams of various features of a data processing system in accordance with an embodiment.

Figure 1C:
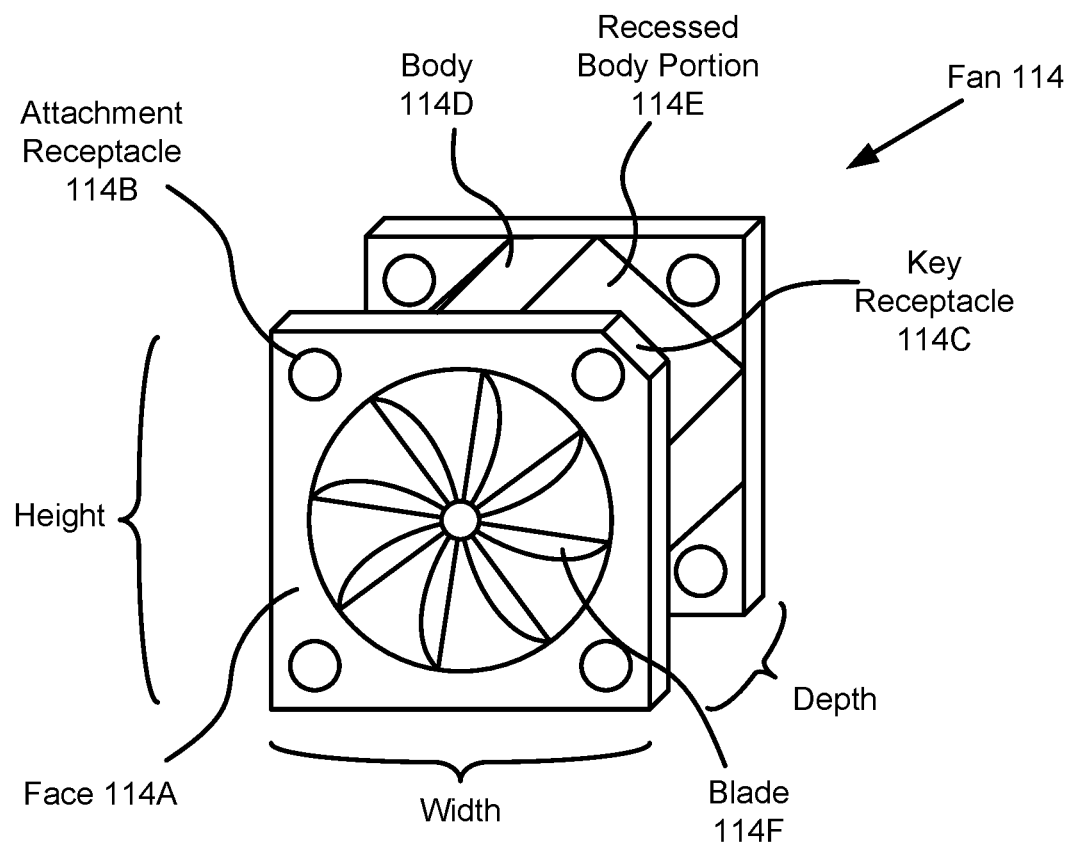
FIG. 1C shows a diagram of a fan in accordance with an embodiment.

Turning to FIG. 1C a diagram of fan 114 in accordance with an embodiment is shown. As noted above, fan 114 may selectively generate flows of gasses.

To do so, fan 114 may include any number of blades (e.g., 114F), a motor (not shown) coupled to the blades, a wiring harness (not shown) to obtain electrical power, etc. (e.g., in aggregate the "active components").

To orient and position fan 114 (e.g., to direct the gas flow), fan 114 may include body 114D in which the active components are positioned. Body 114D may be a physical structure (e.g., such as a plastic injection molded part), and may include faces (e.g., 114A) through which a flow of gas is generated. Attachment receptacles (e.g., 114B) may be positioned on the faces to facilitate reversible connection and alignment of body 114D with other structures. Attachment receptacles 114B may include, for example, holes through which bolts, connectors, pins, raised members, and/or other structures may be positioned.

To further facilitate alignment and connection with other components, body 114D may include any number of key receptacles (e.g., 114C). As seen in FIG. 1C, body 114D may be a substantially symmetrical structure which may lead to a confusion regarding how it should be positioned with respect to other components. The key receptacles 114C may be implemented with mechanical features (e.g., that break the symmetry) that limit placement of fan 114 in various positions. For example, key receptacle 114C may limit placement of fan 114 to certain orientations when complementary keys (refer to FIG. 1D for additional details) are present in the various locations where fan 114 may be positioned.

While illustrated in FIG. 1C with key receptacle 114C being positioned on an outer surface of body 114D, it will be appreciated that key receptacles may be positioned elsewhere without departing from embodiments disclosed herein. For example, body 114D may include a recessed portion (e.g., 114E) on which a key receptacle may be positioned.

While illustrated in FIG. 1C with a limited number of specific components in specific location and orientations, a fan may include additional, fewer, and/or different components in different positions/orientation than shown in FIG. 1C without departing from embodiments disclosed herein.

As seen in FIG. 1C, fan 114 may include various features (e.g., 114B, 114C) usable to position, orient, and/or reversibly attach fan 114 to other components. To manage stack up height and improve flow rates of gasses, an enclosure may include complementary features to position, orient, and/or reversibly attach any number of fan 114 in an fan area.

Figure 1D:
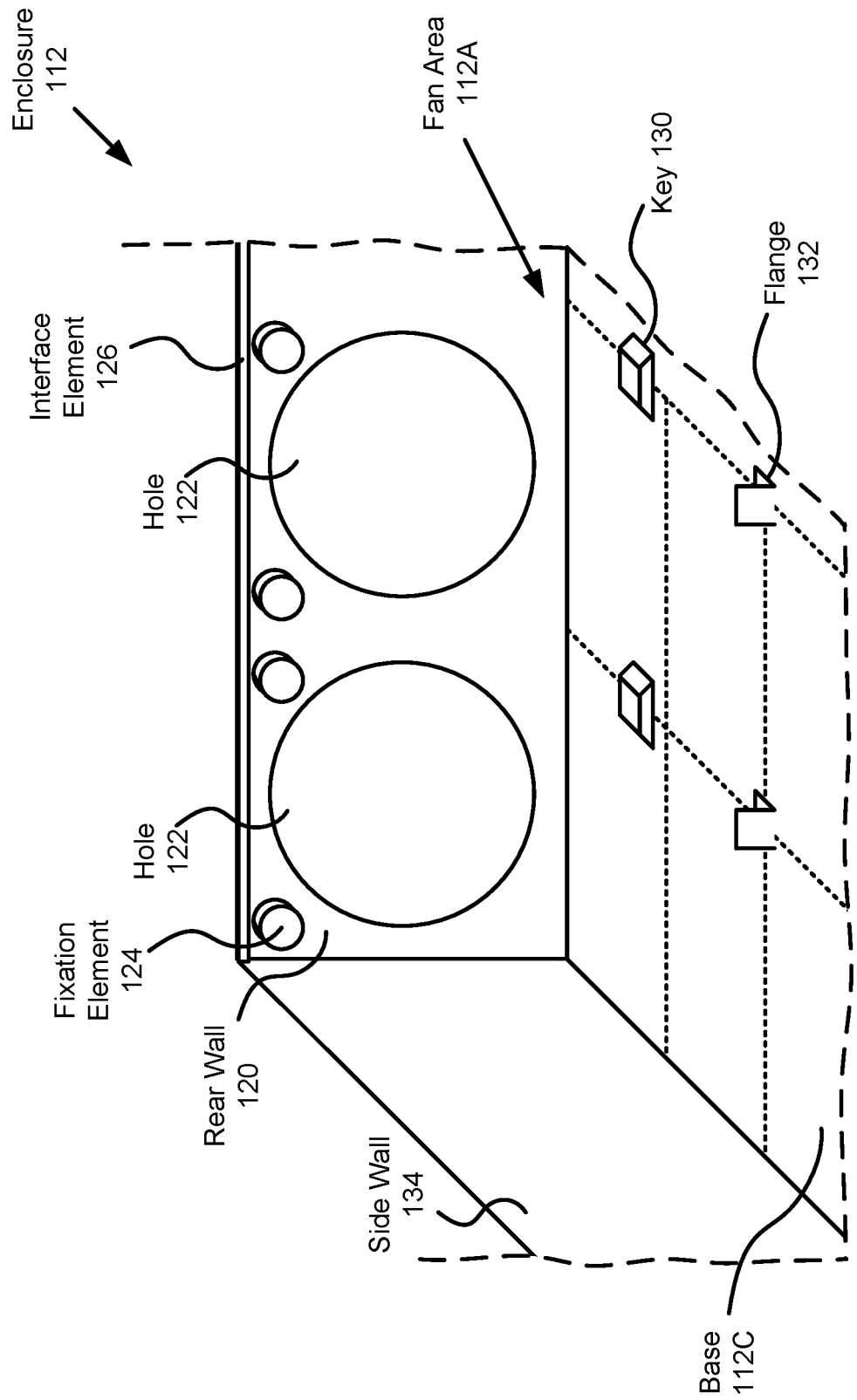
FIG. 1D shows a diagram of an enclosure in accordance with an embodiment.

Turning to FIG. 1D, a diagram of a portion of enclosure 112 in accordance with an embodiment is shown. In FIG. 1D, the viewpoint is from above payload area 112B and looking downward into fan area 112A.

To position and retain fans in fan area 112A while allowing the fan to generate an airflow, fan area 112A may include rear wall 120. Rear wall 120 may be a rear portion of enclosure 112 and may include holes (e.g., 122) through which gasses may pass between the ambient environment and fan area 122A.

Rear wall 120 may also include fixation elements (e.g., 124). The fixation elements may have shapes complementary to attachment receptacles (e.g., 114B) of fan 114. Likewise, some of the fixation elements may be positioned in a pattern complementary to a pattern of the attachment receptacles of fan 114. The fixation elements may be positioned so that when some of the fixation elements are positioned with attachment receptacles, then a flow of gas generated by fan 114 will be aligned with a hole.

The fixation elements may be implemented with protrusions from a surface of rear wall 120. The protrusions may also include threaded holes (not shown) or other features to fixedly secure a fan to the fixation elements.

To position a fan with a hole, the fan may be positioned on a base (e.g., 112C) of enclosure 112. The attachment receptacles may be aligned with the fixation elements associated with the hole. Then, the fan may be moved toward rear wall 120 (e.g., until a face of the fan is up against it). When so positioned, the fixation elements in the attachment receptacles may not allow the fan to move along the surface of rear wall 120. Rather, motion of the fan may be restricted to moving towards or away from rear wall 120 (e.g., due to interface of the fixation elements and the attachment receptacles).

To orient the fans prior to placement along rear wall 120, fan area 112A may also include key 130. Key 130 may be a physical structure positioned on base 112C that is complementary to a key receptacle of a fan. For example, key 130 may be a raised portion of base 112C that prevents a fan from being positioned on base 112C unless oriented in a predetermined manner. Key 130 may generally ensure that the direction of airflow generated by a fan is in an expected direction by ensuring that the fan is oriented in accordance with the expected airflow direction.

To further restrict motion of a fan positioned with base 112C and rear wall 120, rear wall 120 may include interface element 126. Interface element 126 may be a raised portion of rear wall 120 that is complementary to a recessed portion (not shown in FIG. 1C) of a face of a fan. When a face of a fan is positioned on rear wall 120, interface element 126 may further restrict motion of the fan along the surface of rear wall 120.

Generally, fans positioned in fan area 112A may be arranged in two rows. A first row may be positioned on rear wall 120, as discussed above. The second row may be positioned on the other side of the first row.

To retain the position of the two rows of fans, fan area 112A may also include any number of flanges (e.g., 132). The flanges may be raised portions positioned on base 112C. The flanges may be positioned away from rear wall 120 by a depth of two fans. In FIG. 1D, dotted lines are superimposed over base 112C to illustrated where fans may be placed. When two fans are placed between flange 132 and rear wall 120, the fans may generally be held fixedly in place (e.g., the corresponding fixation elements may restrict two degrees of motion and flange 132 may restrict the third degree of motion).

When so positioned, the two fans may be attached to one another via the attachment elements of each fan. For example, pins, bolts, and/or other attachment structures may be used to attach the two fans to one another.

Generally, the fans may be positioned across the width (e.g., left to right in FIG. 1D) of fan area 112A directly adjacent to one another. To further constrain mobility of the fans, enclosure may include side walls (e.g., 134) that may delineate the width of fan area 112A.

However, in contrast to payload area 112B, fan area 112A may not include a cover. Further, the height of rear wall 120 and side wall 134 (e.g., as measured from base 112C) may be the same as the height of the fans positioned in fan area 112A. Consequently, but for the thickness of base 112C (e.g., a portion of sheet metal), substantially all of the height of fan area 112A may be used to house fans thereby increasing the potential rate of gas flow when compared to scenarios in which a cover may also be used, which may decrease the vertical area usable for housing fans.

Figure 1E:
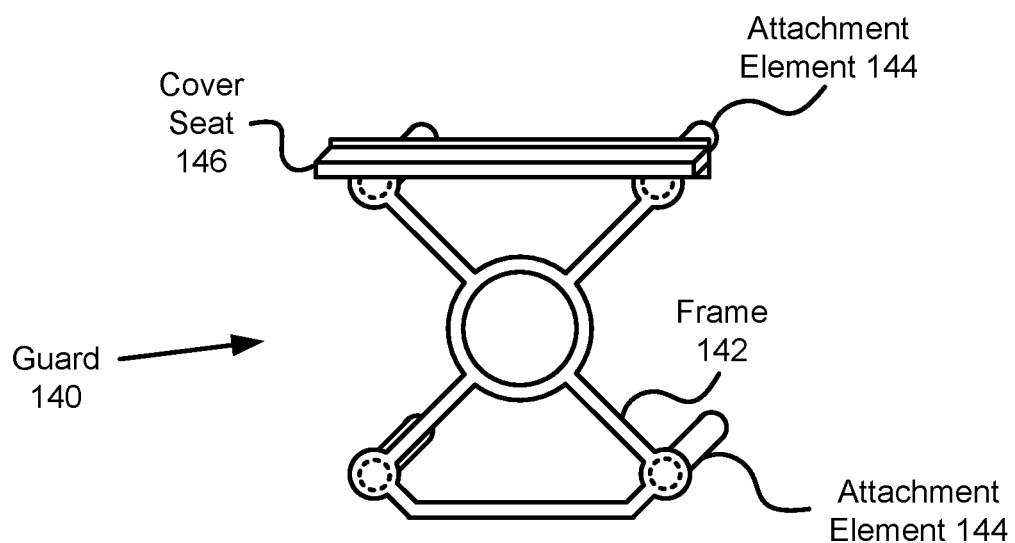
FIG. 1E shows a diagram of a guard in accordance with an embodiment.

To facilitate use of a cover with payload area 112B, the fans may be used, in part, to support the cover. Turning to FIG. 1E, a diagram of guard 140 in accordance with an embodiment is shown. Guard 140 may be used to facilitate placement of a portion of a cover with the fans. Guard 140 may reversibly attach to a fan positioned in fan area 112A, and may present a physical structure on which the portion of the cover may be positioned. To provide its functionality, guard may include attachment elements (e.g., 144), a frame (e.g., 142), and a cover seat (e.g., 146). Each of these components is discussed below.

Attachment elements (e.g., 144) may facilitate reversible attachment of frame 142 to a fan. Attachment elements may connect to the attachment receptacles of a fan. For example, attachment elements 144 may be implemented with clips or other structures that may inserted into the attachment receptacles. Once inserted, the clips may expand or otherwise change their shape to attach frame 142 both reversibly and fixedly to the fan.

Cover seat 146 may be a physical structure upon which a portion of a cover may be positioned. For example, cover seat may be implemented with a portion of material that may extend from a face of a fan while guard 140 is attached to the fan. The portion of material may be below the top of the fan (e.g., by a thickness of the cover). Consequently, when the portion of the cover is positioned on cover seat 146, the top of the cover and the top of the fan may be substantially aligned with one another (e.g., coplanar). Consequently, the stack up height of the fan are 112A and payload area 112B may be substantially the same.

Frame 142 may be implemented with a physical structure that interconnects attachment elements of guard 140 and cover seat 146. Frame 142 may have a shape that, when attachment elements 144 are positioned with the attachment receptacles of a fan, positions and orients cover seat 146 with respect to the top of the fan, as noted above.

Figure 1F:
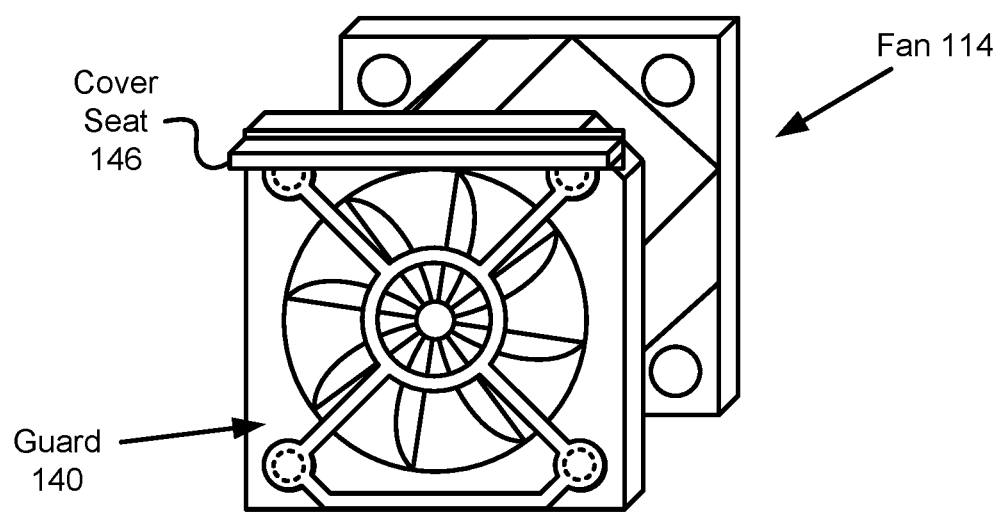
FIG. 1F shows a diagram of a guard positioned with a fan in accordance with an embodiment.

For example, turning to FIG. 1F a diagram of guard 140 attached to fan 114 in accordance with an embodiment is shown. As seen in FIG. 1F, the top of cover seat 146 may be positioned below the top of fan 114. Consequently, the cover may be aligned with the top of fan 114 when positioned on cover seat 146. Additionally, as seen in FIG. 1F, frame 142 may include open areas that facilitate the flow of gas through the enclosure.

Figure 1G:
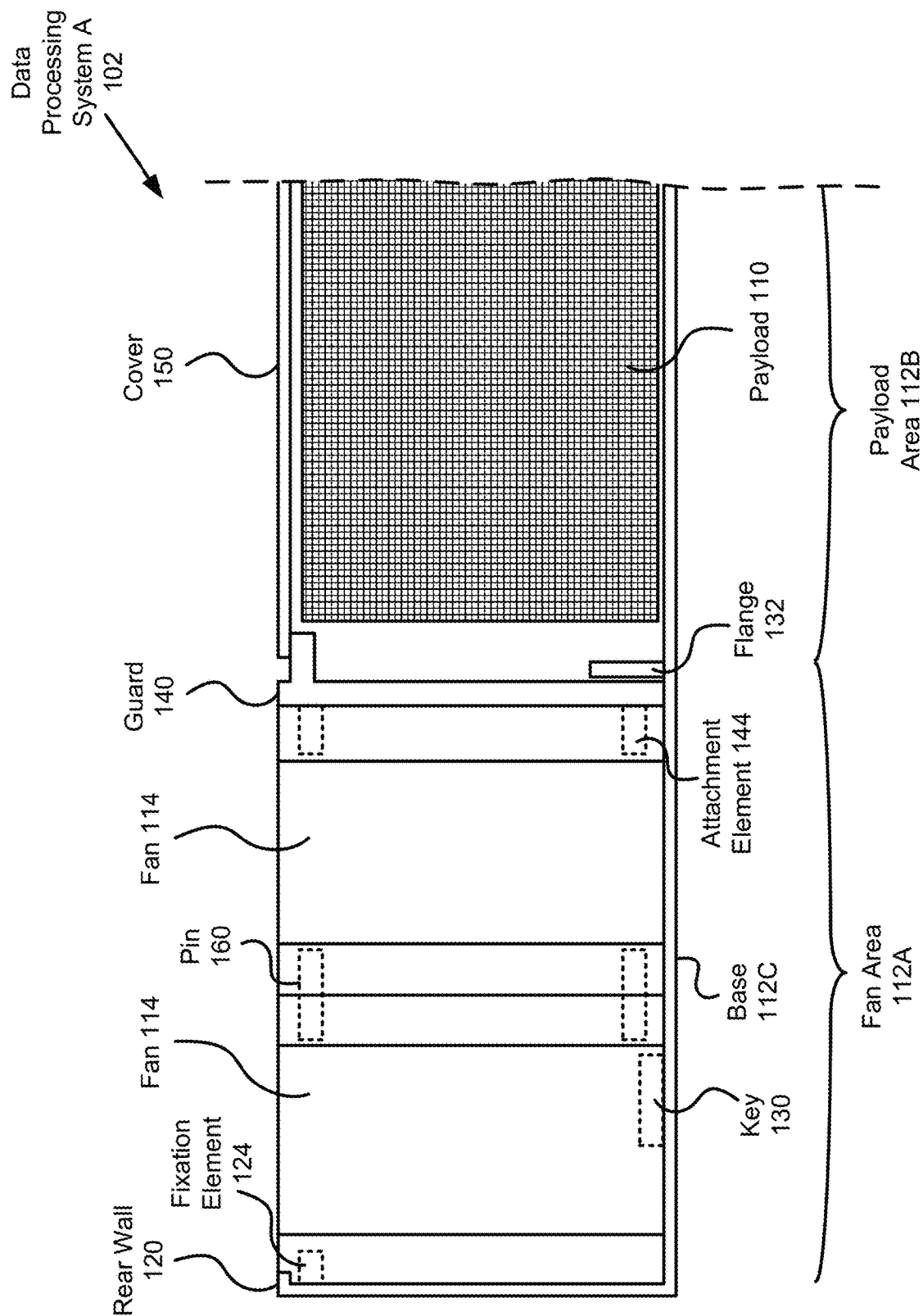
FIG. 1G shows a side view diagram of fans positioned in an enclosure of data processing system in accordance with an embodiment.

Turning to FIG. 1G, a side view diagram of data processing system A 102 in accordance with an embodiment is shown. In FIG. 1G, a side wall that would otherwise obscure the view of the interior of the enclosure has been removed for illustrative purposes only.

As in FIG. 1G, when fans (e.g., 114) are positioned in fan area 112A, the fans may be connected to one another via pins (e.g., 160, drawn in FIG. 1G with dashed outline to indicate that they are obscured from view by the bodies of the fans), or other types of reversible fixation elements. When so positioned, a stack up height of fan area 112A may be the same (e.g., substantially the same) as the stack up height of payload area 112B when cover 150 (e.g., a portion of sheet metal that may include various structures to facilitate attachment to other portions of the enclosure of data processing system A 102).

Figure 1H:
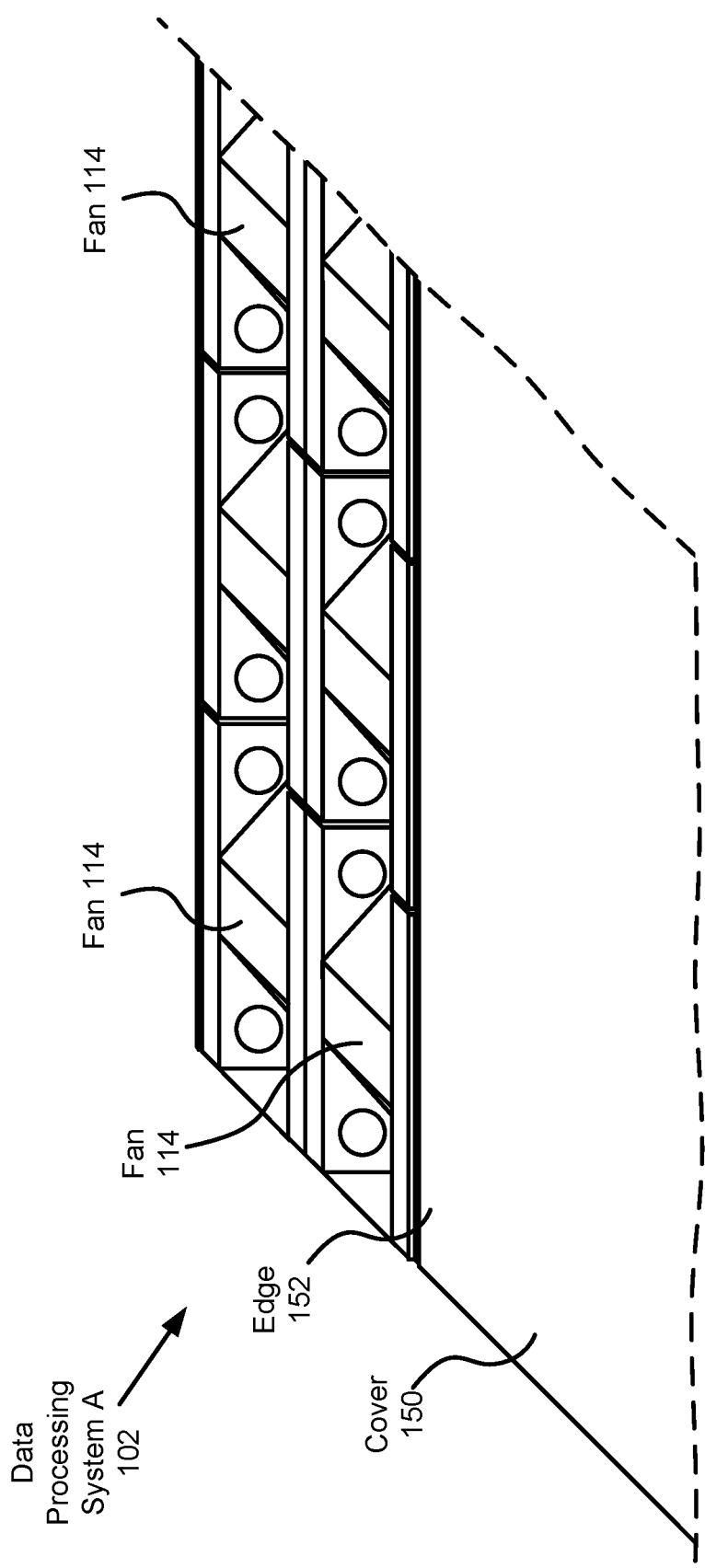
FIG. 1H shows a diagram of a cover of an enclosure of data processing system in accordance with an embodiment.
Figure 1I:
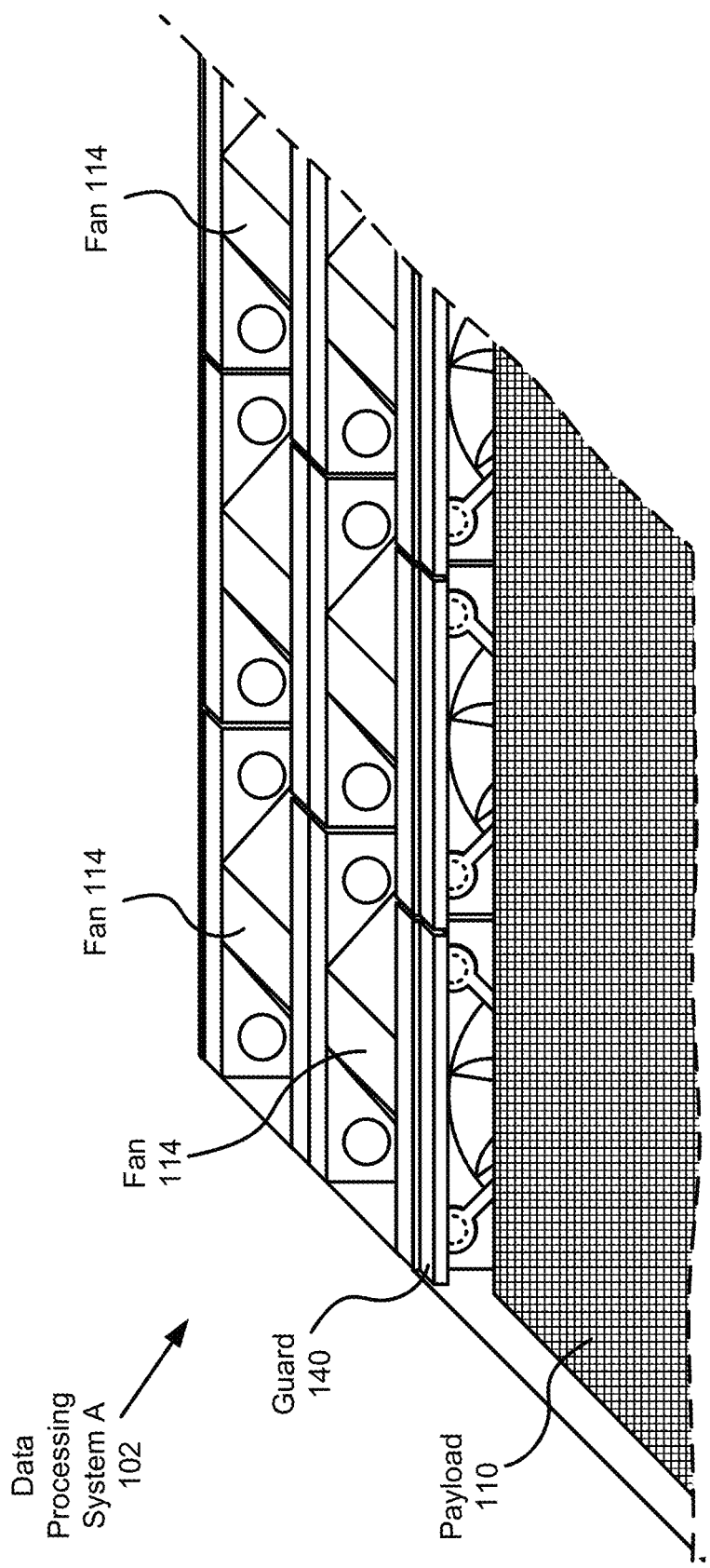
FIG. 1I shows a diagram of an enclosure of a data processing system without a cover in accordance with an embodiment.

Turning to FIGS. 1H-1I, diagrams of data processing system A 102 in accordance with an embodiment. In both figures, the viewpoint is similar to the viewpoint shown in FIG. 1D. However, in FIGS. 1H-1I, fans and a payload are positioned in data processing system A 102. In FIG. 1H, cover 150 is closed and in FIG. 1I cover 150 is open.

As seen in FIG. 1H, while cover 150 is closed, tops of fans 114 are exposed. While closed, edge 152 of cover 150 may be positioned on guard 140.

As seen in FIG. 1I, the instances of guard 140 are attached to corresponding fans. Force applied to guard 140 by edge 152 of cover 150 may be transmitted to the base of the enclosure via the fans and the instances of guard 140.

As discussed with respect to FIG. 1A, data processing systems 100 may be implemented with a computing device. For example, the payload positioned in a payload area of an enclosure of a data processing system may include a computing device. The computing device may provide computer implemented services to users of the data processing system and/or other devices operably connected to the data processing system.

Figure 2:
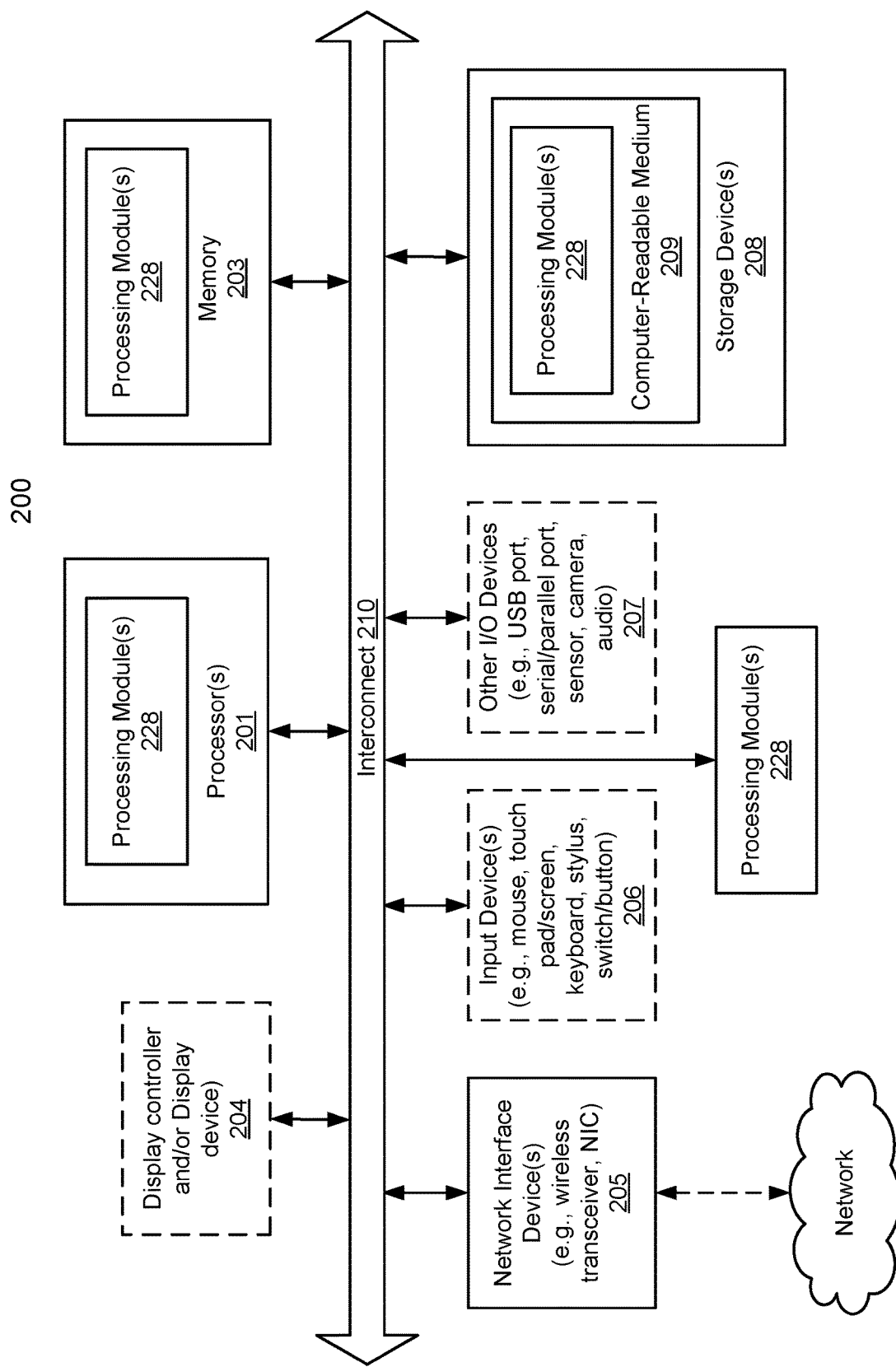
FIG. 2 shows a block diagram illustrating a computing device in accordance with an embodiment.

Turning to FIG. 2, a block diagram illustrating an example of a computing device in accordance with an embodiment is shown. For example, system 200 may represent any of the data processing systems and/or computing devices described above performing any of the processes or methods described above. System 200 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 200 is intended to show a high-level view of many components of the computer system. However, it is to be understood that additional components may be present in certain implementations and furthermore, different arrangement of the components shown may occur in other implementations. System 200 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 200 includes processor 201, memory 203, and devices 205-208 via a bus or an interconnect 210. Processor 201 may represent a single processor or multiple processors with a single processor core or multiple processor cores included therein. Processor 201 may represent one or more general-purpose processors such as a microprocessor, a central processing unit (CPU), or the like. More particularly, processor 201 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 201 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 201, which may be a low power multi-core processor socket such as an ultra-low voltage processor, may act as a main processing unit and central hub for communication with the various components of the system. Such processor can be implemented as a system on chip (SoC). Processor 201 is configured to execute instructions for performing the operations discussed herein. System 200 may further include a graphics interface that communicates with optional graphics subsystem 204, which may include a display controller, a graphics processor, and/or a display device.

Processor 201 may communicate with memory 203, which in one embodiment can be implemented via multiple memory devices to provide for a given amount of system memory. Memory 203 may include one or more volatile storage (or memory) devices such as random access memory (RAM), dynamic RAM (DRAM), synchronous DRAM (SDRAM), static RAM (SRAM), or other types of storage devices. Memory 203 may store information including sequences of instructions that are executed by processor 201, or any other device. For example, executable code and/or data of a variety of operating systems, device drivers, firmware (e.g., input output basic system or BIOS), and/or applications can be loaded in memory 203 and executed by processor 201. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 200 may further include IO devices such as devices (e.g., 205, 206, 207, 208) including network interface device(s) 205, optional input device(s) 206, and other optional IO device(s) 207. Network interface device(s) 205 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 206 may include a mouse, a touch pad, a touch sensitive screen (which may be integrated with a display device of optional graphics subsystem 204), a pointer device such as a stylus, and/or a keyboard (e.g., physical keyboard or a virtual keyboard displayed as part of a touch sensitive screen). For example, input device(s) 206 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 207 may include an audio device. An audio device may include a speaker and/or a microphone to facilitate voice-enabled functions, such as voice recognition, voice replication, digital recording, and/or telephony functions. Other IO devices 207 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 207 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 210 via a sensor hub (not shown), while other devices such as a keyboard or thermal sensor may be controlled by an embedded controller (not shown), dependent upon the specific configuration or design of system 200.

To provide for persistent storage of information such as data, applications, one or more operating systems and so forth, a mass storage (not shown) may also couple to processor 201. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 201, e.g., via a serial peripheral interface (SPI). This flash device may provide for non-volatile storage of system software, including a basic input/output software (BIOS) as well as other firmware of the system.

Storage device 208 may include computer-readable storage medium 209 (also known as a machine-readable storage medium or a computer-readable medium) on which is stored one or more sets of instructions or software (e.g., processing module, unit, and/or processing module/unit/logic 228) embodying any one or more of the methodologies or functions described herein. Processing module/unit/logic 228 may represent any of the components described above. Processing module/unit/logic 228 may also reside, completely or at least partially, within memory 203 and/or within processor 201 during execution thereof by system 200, memory 203 and processor 201 also constituting machine-accessible storage media. Processing module/unit/logic 228 may further be transmitted or received over a network via network interface device(s) 205.

Computer-readable storage medium 209 may also be used to store some software functionalities described above persistently. While computer-readable storage medium 209 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 228, components and other features described herein can be implemented as discrete hardware components or integrated in the functionality of hardware components such as ASICS, FPGAs, DSPs or similar devices. In addition, processing module/unit/logic 228 can be implemented as firmware or functional circuitry within hardware devices. Further, processing module/unit/logic 228 can be implemented in any combination hardware devices and software components.

Note that while system 200 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system that provides computer implemented services, the data processing system comprising:
   a payload comprising hardware components that provides the computer implemented services;
   fans to cool the payload while the hardware components are providing the computer implemented services;
   an enclosure comprising:
      a payload area in which the payload is positioned, and
      a fan area in which the fans are positioned, the fan area comprising a guard adapted to attach to at least one fan of the fans, the guard comprising:
         a cover seat to receive a cover while the cover closes the payload area; and
         attachment elements to reversibly attach the guard to the at least one fan; and
   the cover, wherein the cover covers the payload and leaves the fans exposed while the cover is closed,
   wherein in an operating state of the data processing system, the fan area is left coverless without another cover separate from the cover being installed over the fan area.

2. The data processing system of claim 1, wherein a top of the cover and tops of the fans are substantially coplanar while the cover is closed such that the tops of the fans are exposed to the same external environment of the data processing system as the top of the cover.

3. The data processing system of claim 1, wherein while the cover is closed, the fans transmit at least a portion of force applied by the cover to a base of the data processing system.

4. The data processing system of claim 1, wherein while the fans are in the fan area, the fans are positioned directly adjacent to one another across a width of the fan area, and the fans being oriented, while in the fan area, to generate a flow of gas directed across the width of the fan area and through the payload area to cool the payload.

5. The data processing system of claim 4, wherein a height of the data processing system is defined by a height of a stack up of a base of the enclosure and the fans, wherein the fans are positioned in a single layer on the base.

6. The data processing system of claim 5, wherein the base has a thickness of a single layer of material that delimits the thickness of the base.

7. The data processing system of claim 6, wherein, while covering the payload, the cover is a same or a smaller distance away from the base than the height of the fans positioned on the single layer of the base.

8. The data processing system of claim 1, wherein the fan area comprises: a wall comprising fixation elements for reversible attachment of a portion of the fans, the fixation elements aligning airflows generated by the portion of the fans with holes in the wall; a portion of a base on which the fans are positioned while in the enclosure, the base comprising: keys having a shape that orients the portion of the fans positioned in the enclosure, the keys, during an insertion of one or more fans of the portion of the fans, preventing the one or more fans from being seated unless oriented in a predetermined orientation; flanges positioned a distance away from the wall to accommodate positioning of two fans of the fans between the flange and the wall, the wall being positioned at a first end of the base, and wherein the guard further comprises: a frame having a shape that connects the attachment elements to the cover seat and that, when connected to the at least one fan, positions the cover seat a predetermined distance below a top of the at least one fan, the top of the at least one fan being positioned at a top of the data processing system.

9. The data processing system of claim 8, wherein each of the flanges comprises a raised portion that prevents the two fans from moving away from the wall while the two fans are on the portion of the base.

10. The data processing system of claim 9, wherein each of the fans comprises: a face; and an attachment receptacle on the face, the attachment receptacle having a shape that is complementary to a shape of one of the fixation elements.

11. The data processing system of claim 10, wherein the shape of the one of the fixation elements limits motion of a fan of the two fans with respect to the wall while the one of the fixation elements is positioned in the attachment receptacle.

12. The data processing system of claim 1, wherein the motion of the fan of the two fans is limited along the wall and allowed in a direction orthogonal to a surface of the wall to which the face of the fan of the two fans is positioned while the one of the fixation elements is positioned in the attachment receptacle.

13. An enclosure for a data processing system, comprising:
    a payload area adapted to house a payload of hardware components for providing computer implemented services;
    a fan area adapted to house fans, the fan area comprising a guard adapted to attach to at least one fan of the fans, the guard comprising:
        a cover seat to receive a cover while the cover closes the payload area; and
        attachment elements to reversibly attach the guard to the at least one fan;
    the fans positioned in the fan area to generate a flow of gas through the payload area while the fans are operating; and
    the cover, wherein the cover covers the payload area and leaves the fan area exposed while the cover is closed, wherein in an operating state of the data processing system, the fan area is left coverless without another cover separate from the cover being installed over the fan area.

14. The enclosure of claim 13, wherein a top of the cover and tops of the fans are substantially coplanar while the cover is closed.

15. The enclosure of claim 13, wherein while the cover is closed, the fans transmit at least a portion of force applied by the cover to a base of the enclosure.

16. The enclosure of claim 13, wherein the fan area comprises:
    a wall comprising fixation elements for reversible attachment of a portion of the fans, the fixation elements aligning airflows generated by the portion of the fans with holes in the wall;
    a portion of a base on which the fans are positioned while in the enclosure, the base comprising:
        keys having a shape that orients the portion of the fans positioned in the enclosure, the keys, during an insertion of one or more fans of the portion of the fans, preventing the one or more fans from being seated unless oriented in a predetermined orientation;
        flanges positioned a distance away from the wall to accommodate positioning of two fans of the fans between the flange and the wall, the wall being positioned at a first end of the base, and
    wherein the guard further comprises:
        a frame having a shape that connects the attachment elements to the cover seat and that, when connected to the at least one fan, positions the cover seat a predetermined distance below a top of the at least one fan, the top of the at least one fan being positioned at a top of the enclosure.

17. The enclosure of claim 16, wherein each of the flanges comprises a raised portion that prevents the two fans from moving away from the wall while the two fans are on the portion of the base.

18. The enclosure of claim 17, wherein each of the fans comprises:
    a face; and
    an attachment receptacle on the face, the attachment receptacle having a shape that is complementary to a shape of one of the fixation elements.

19. The enclosure of claim 18, wherein the shape of the one of the fixation elements limits motion of a fan of the two fans with respect to the wall while the one of the fixation elements is positioned in the attachment receptacle.

20. The enclosure of claim 19, wherein the motion of the fan of the two fans is limited along the wall and allowed in a direction orthogonal to a surface of the wall to which the face of the fan of the two fans is positioned while the one of the fixation elements is positioned in the attachment receptacle.

* * * * *